United States Patent [19]

Takayanagi

[11] Patent Number: 5,136,545
[45] Date of Patent: Aug. 4, 1992

[54] SEMICONDUCTOR MEMORY DEVICE HAVING A SENSITIVITY CONTROLLABLE SENSE AMPLIFIER CIRCUIT

[75] Inventor: Toshinari Takayanagi, Kanagawa, Japan

[73] Assignee: Kabushiki Kaisha Toshiba, Kanagawa, Japan

[21] Appl. No.: 619,418

[22] Filed: Nov. 29, 1990

[30] Foreign Application Priority Data

Dec. 12, 1989 [JP] Japan .................. 1-320611

[51] Int. Cl.⁵ .................................. G11C 13/00
[52] U.S. Cl. ........................ 365/203; 365/226
[58] Field of Search ............ 365/203, 226, 227, 182

[56] References Cited

U.S. PATENT DOCUMENTS 5,045,726  9/1991  Leung ..................... 365/189.01

Primary Examiner—Terrell W. Fears
Attorney, Agent, or Firm—Finnegan, Henderson, Farabow, Garrett and Dunner

[57] ABSTRACT

A semiconductor memory device includes a sense amplifier circuit which includes a load circuit. The impedance of the load circuit is adjustable by a bias voltage. The bias voltage is generated by a bias circuit which also controls a bit line initial potential.

10 Claims, 5 Drawing Sheets

5,136,545

SEMICONDUCTOR MEMORY DEVICE HAVING A SENSITIVITY CONTROLLABLE SENSE AMPLIFIER CIRCUIT

BACKGROUND OF THE INVENTION

1. Field of the Invention

This invention concerns a semiconductor memory device. More particularly, this invention concerns an improvement of a sense amplifier circuit used in a semiconductor memory device.

2. Description of the Prior Art

The following items are important factors for a sense amplifier circuit used in a semiconductor memory device, e.g., a Static Random Access Memory (SRAM) device. (1) to output differential output signals of large amplitude with high sensitivity; (2) to have a wide sensing area or a large sensing margin against the variation of the bit line initial potential (bit line potential before the access to a memory cell) (3) a small occupying area and a low power consumption. FIG. 1 shows a conventional sense amplifier circuit used in a SRAM device. The sense amplifier 50 includes two sense amplifier circuits 51 and 52 each having a current mirror circuit 53 as a load circuit. The sense amplifier circuit 50 is superior in the above items (1) and (2), but is inferior in the above item (3) due to the use of two amplifier circuits 51 and 52.

Considering this point, an improved sense amplifier as shown in FIG. 2 is disclosed in Japanese laid open Patent: Hei 1-130619 (Japanese Patent Application: Sho 62-289773). As shown in FIG. 2, the sense amplifier circuit 60 includes a differential type sense amplifier circuit 61 and a bias circuit 62.

The differential type sense amplifier circuit 61 includes two P-type MOS (hereafter called as PMOS) transistors P1 and P2 and two N-type MOS (hereafter called as NMOS) transistors N3 and N4. The source electrodes of the transistors P1 and P2 are supplied with the power source voltage Vcc. The drain electrodes of the NMOS transistors N3 and N4 are connected to the drain electrodes of the transistors P1 and P2, and the source electrodes thereof are supplied with the reference voltage Vss through an NMOS transistor N5. The gate electrodes of the transistors N3 and N4 are connected to bit lines BL and $\overline{BL}$, respectively.

The bias circuit 62 includes a PMOS transistor P6 and two NMOS transistor N7 and N8. The source electrode of the transistor P6 is supplied with the power source voltage Vcc, and the drain electrode and the gate electrode thereof are connected in common. The drain electrode of the transistor N7 is connected to the drain electrode of the transistor P6. The drain electrode of the transistor N8 is connected to the source electrode of the transistor N7, and the source electrode thereof is supplied with the reference voltage Vss.

The gate electrode of the transistor N7 is supplied with a constant voltage VC which is determined by the bit line initial potential. The gate electrode of the transistor N8 is supplied with the power source voltage Vcc. The gate electrodes of the transistors P1 and P2 are connected to the gate electrode of the transistor P6.

In this sense amplifier circuit, the impedance of the load circuit 63 composed of PMOS transistors P1 and P2 can be controlled so as to achieve a high sensitivity by adjusting the bias voltage VL. Since the bias voltage VL is adjustable by the constant voltage VC, the constant voltage VC is determined or set so as to achieve a high sensitivity considering the bit line initial potential. The constant voltage VC is equal to the bit line initial potential, for example.

However, the bit line potential varies between the bit lines due to the fluctuation of processing and the noise on the power source line. Therefore, it is difficult to represent the initial potential of the all bit lines by the single potential VC.

FIG. 3 shows a change of the sensitivity of the sense amplifier 61 with respect to the change of the bit line initial potential. In FIG. 3, it is assumed that 0.2 volt exists as a difference voltage between the bit lines in a pair, and a constant voltage VC of 2.0 volt is applied to the gate electrode of the NMOS transistor N7. As shown in FIG. 3, the sensing area where a high gain can be achieved is narrow. Thus, the choice of the constant voltage VC becomes critical.

To stabilize the bit line initial potential, a load circuit 80 is often used to set the bit line potential to Vcc−Vthn as shown in FIG. 4. Namely, the load circuit 80 includes NMOS transistors NL1 and NL2 which are supplied with an inverted signal $\overline{W}$ of the write control signal W at the gate electrodes thereof. By making the transistors NL1 and NL2 ON state, the initial bit line potential is set to Vcc−Vthn at the read operation. Vthn is the threshold voltage of the NMOS transistors NL1 and NL2.

However, when the SRAM cell 81 is not accessed for a relatively long time, the bit lines BL, $\overline{BL}$ are charged to approximately Vcc (overprecharge) by the leak current of the load transistors NL1 and NL2. Thus, the sensitivity of the sense amplifier circuit drops.

SUMMARY OF THE INVENTION

Therefore, an object of the present invention is to provide a semiconductor memory device in which the sensitivity of the sense amplifier circuit is kept high in spite of the variation of the bit line initial potential.

Another object of the present invention is to provide a semiconductor memory device in which the variation of the bit line initial potential at each bit line pair can be effectively supressed.

A further object of the present invention is to provide a semiconductor memory device of high integration and of a low power consumption.

To achieve the objects, this invention provides a semiconductor memory device, comprising: a pair of bit lines having an initial potential and operating to transfer data from a memory cell; first bias means for producing a first bias voltage and a second bias voltage in response to a first power source voltage and a reference voltage; second bias means for producing a third bias voltage in response to the first power source voltage, the reference voltage and the first bias voltage; adjusting means coupled to the bit lines for adjusting the potential of the bit lines in response to the second bias voltage; and sensing means including a load circuit for sensing the data of the bit lines, wherein the impedance of the load circuit is controlled by the third bias voltage.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
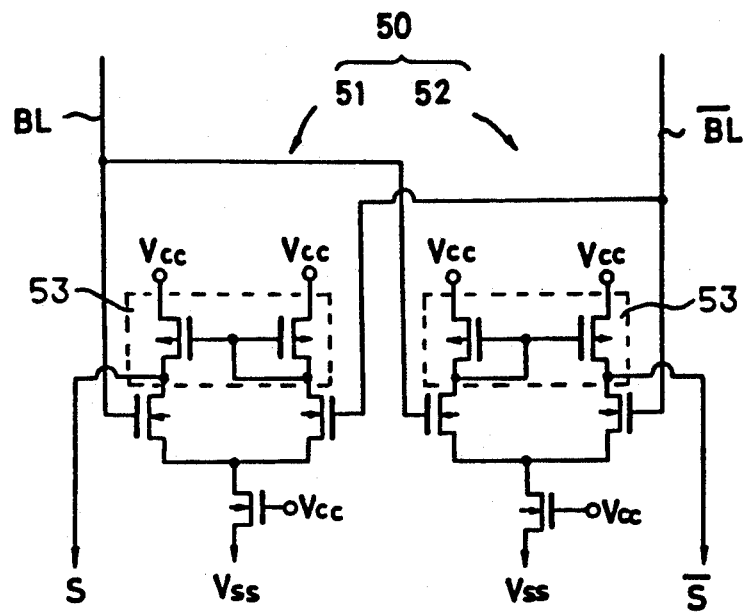
FIG. 1 is a circuit diagram of a conventional sense amplifier circuit.
Figure 2:
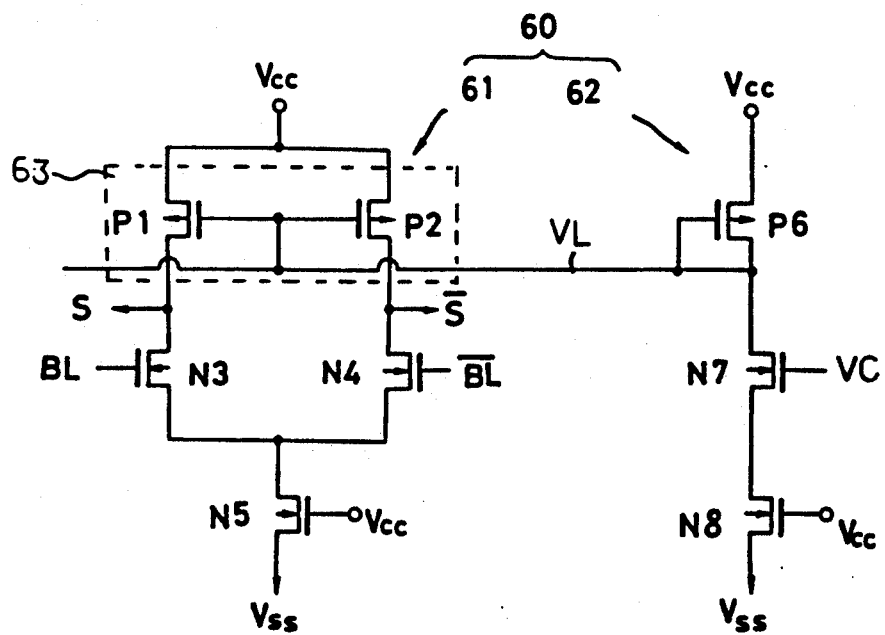
FIG. 2 is a circuit diagram of another conventional sense amplifier circuit in which the impedance of the load circuit is adjustable.
Figure 3:
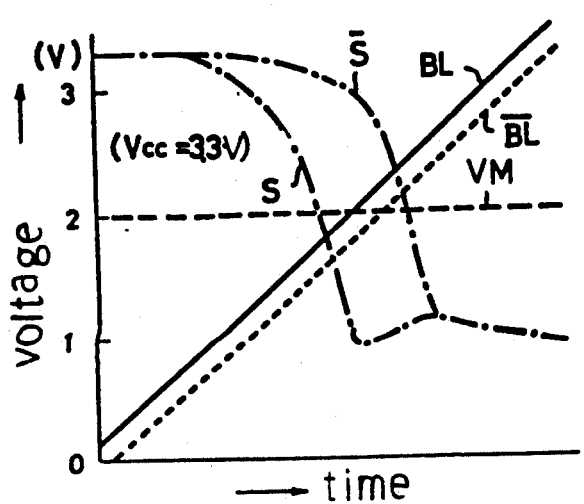
FIG. 3 is a characteristic curve of the conventional sense amplifier shown in FIG. 2.
Figure 4:
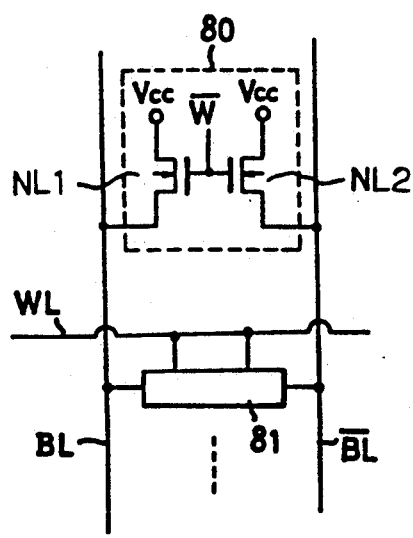
FIG. 4 is a circuit diagram of a further conventional semiconductor memory device.
Figure 5:
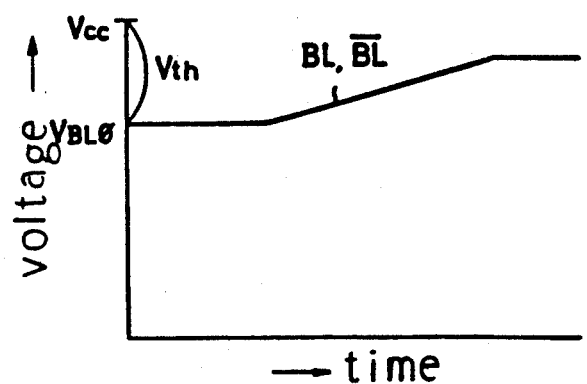
FIG. 5 is a drawing which shows the phenomenon of overprecharge.
Figure 6:
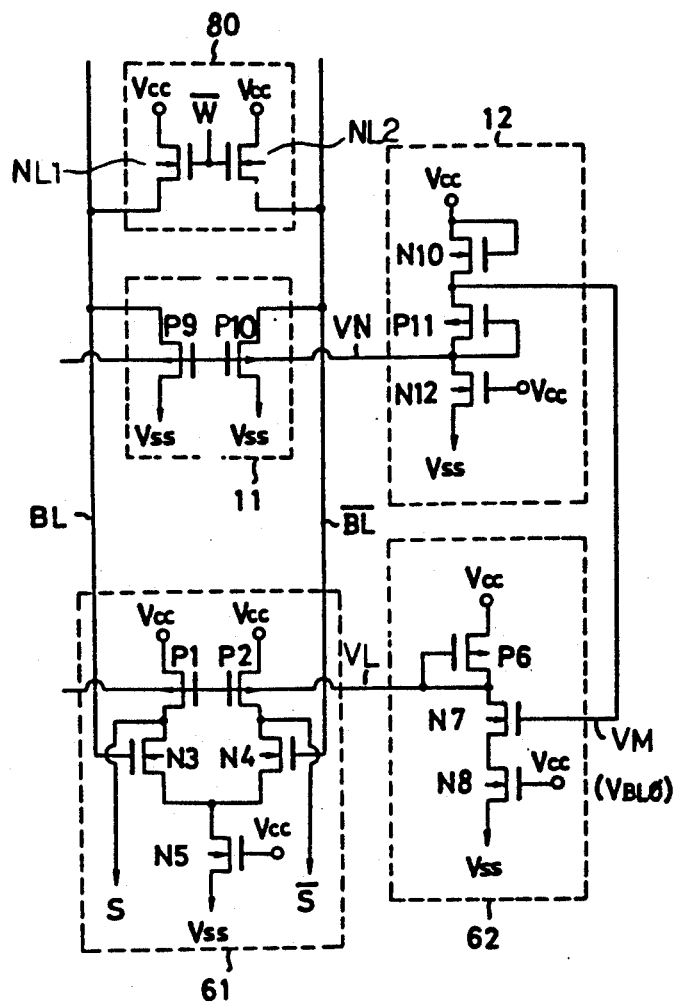
FIG. 6 is a circuit diagram of a first embodiment of the present invention.

Referring now to the drawings, the present invention will be explained. FIG. 6 is a circuit diagram of a first embodiment of the present invention. In FIG. 6, numerals BL and $\overline{BL}$ designate bit lines which transfer data from a memory cell (not shown) to a sense amplifier circuit 61.

The sense amplifier circuit 61 includes NMOS transistors N3 and N4. The gate electrodes of the transistors N3 and N4 are connected to the bit lines BL and $\overline{BL}$, respectively. The source electrodes of the transistors N3 and N4 are commonly connected and are connected to the drain electrode of an NMOS transistor N5. The gate electrode of the NMOS transistor N5 is supplied with the power source voltage Vcc, and the source electrode thereof is supplied with the reference voltage Vss.

The drain electrodes of the NMOS transistors N3 and N4 are supplied with the power source voltage Vcc through PMOS transistors P1 and P2, respectively. Namely, the drain electrodes of the NMOS transistors N3 and N4 are connected to the drain electrodes of the PMOS transistors P1 and P2, and the source electrodes of the PMOS transistors P1 and P2 are supplied with the power source voltage Vcc.

This embodiment includes a bit line load circuit 80 which comprises two NMOS transistors NL1 and NL2. The source electrodes of the NMOS transistors NL1 and NL2 are connected to the bit lines BL and $\overline{BL}$, respectively. The drain electrodes of the NMOS transistors NL1 and NL2 are supplied with the power source voltage Vcc, and the gate electrode thereof are supplied with an inverted signal $\overline{W}$ of a write control signal W (not shown).

In this embodiment, there is provided a first bias circuit 12 which produce a first bias voltage VM and a second bias voltage VN. The first bias circuit 12 includes NMOS transistors N10 and N12 and a PMOS transistor P11. The drain electrode of the transistor N10 is supplied with the power source voltage Vcc and is connected to the gate electrode thereof. The source electrode of the transistor P11 is connected to the source electrode of the transistor N10 and the gate electrode thereof is connected to the drain electrode thereof. The drain electrode of the transistor N12 is connected to the drain electrode of the transistor P11, and the source electrode thereof is supplied with the reference voltage Vss. The gate electrode of the transistor N12 is supplied with the power source voltage Vcc.

In this construction, the transistor N12 is designed to have fairly smaller drivability than the transistors P11 and N10. By making the drivability of the transistor N12 smaller than the transistors N10 and P11, the gate to source voltages Vgs of the NMOS transistor N10 and of the PMOS transistor P11 are approximately equal to those of the threshold voltage Vthn and Vthp, respectively. Thus, the first bias voltage VM and the second bias voltage VN can be expressed as follows.

$$VM = Vcc - Vthn1 \quad (1)$$

$$VN = VM - Vthp1 \quad (2)$$

wherein Vthn1 and Vthp1 are approximately equal to but are slightly larger than the threshold voltages of the transistors N10 and P11, respectively.

In this embodiment, there is further provided a second bias circuit 62 which provides a third bias voltage VL to the sense amplifier circuit 61. The second bias circuit 62 includes one PMOS transistor P6 and two NMOS transistors N7 and N8. The source electrode of the transistor P6 is supplied with the power source voltage Vcc, and the gate electrode thereof is connected to the drain electrode thereof.

The drain electrode of the transistor N7 is connected to the drain electrode of the transistor P6, and the gate electrode thereof is supplied with the first bias voltage VM of the first bias circuit 12. The common connection of the drain electrodes of the transistors P6 and N7 provides the third bias voltage VL, and the third bias voltage VL is supplied to the gate electrodes of the load transistors P1 and P2 in the sense amplifier circuit 61.

In this embodiment, there is still further provided an adjusting circuit 11. The adjusting circuit 11 includes PMOS transistors P9 and P10. The source electrodes of the transistors P9 and P10. The source electrodes of the transistors P9 and P10 are connected to the bit lines BL and $\overline{BL}$, and the drain electrodes thereof are supplied with the reference voltage Vss. The gate electrodes of the transistors P9 and P10 are supplied with the second bias voltage VN of the first bias circuit 12.

The transistors P9 and P10 in the adjusting circuit 11 are designed to flow a current ($<1$ $\mu$A) which is negligible, but is larger than the leak current of the load transistors NL1 and NL2, at the static condition. Thereby, the overprecharge can be prevented.

Now, the operation of the semiconductor memory device will be explained. If the bit line potential is raised higher than a predetermined initial potential VBLO due to some reason, the current of the transistors P9 and P10 increases. Namely, the transistors P9 and P10 operate to discharge the charge of the bit lines and to return the potential of the bit line to the initial value VBLO. Thus, the bit line potential is kept at VBLO. In other words, the bit line initial potential is controlled by the second bias voltage VN.

Since the first bias voltage VM and the second bias voltage VN have a corelation as shown by the equations (1) and (2), the conductivity of the NMOS transistor N7 is controlled, keeping a corelation with respect to the bit line initial potential. Namely, the third bias voltage VL is controlled or adjusted keeping a corelation with respect to the bit line initial potential. As the result, the conductivity of the PMOS transistors P1 and P2 in the sense amplifier circuit 61 can be controlled so as to have a high sensitivity keeping a corelation with respect to the bit line initial potential.

Figure 7:
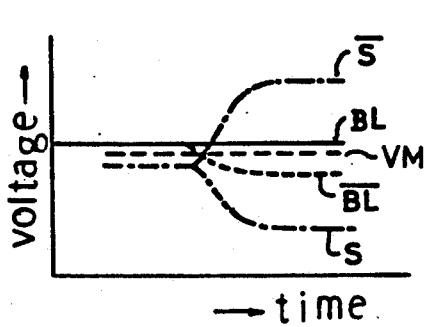
FIG. 7 is a diagram which shows relationship between the output signals, bit line potential and a bias voltage.

FIG. 7 shows the relationship between the first bias potential VM, the bit line potential and the output signals S and S. As shown in FIG. 7, the first bias voltage VM is set slightly lower than the bit line initial potential, and is intermediate between the bit line potentials BL and $\overline{BL}$ after the bit lines are connected to a memory cell. Therefore, by adjusting the impedance of the load circuit in the sense amplifier circuit 61 using the first bias voltage VM, a high sensitivity with respect to both of the high and the low bit line potentials can be insured.

Figure 8:
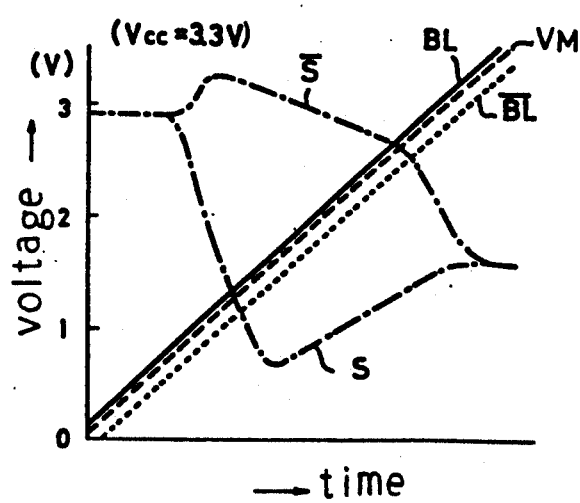
FIG. 8 is a characteristic curve of the first embodiment shown in FIG. 6.

FIG. 8 is a diagram which shows a simulation of the sensitivity of the sense amplifier circuit shown in FIG. 6. As shown in FIG. 8, the sensitivity of the sense amplifier circuit is kept high over a wide range.

Figure 9:
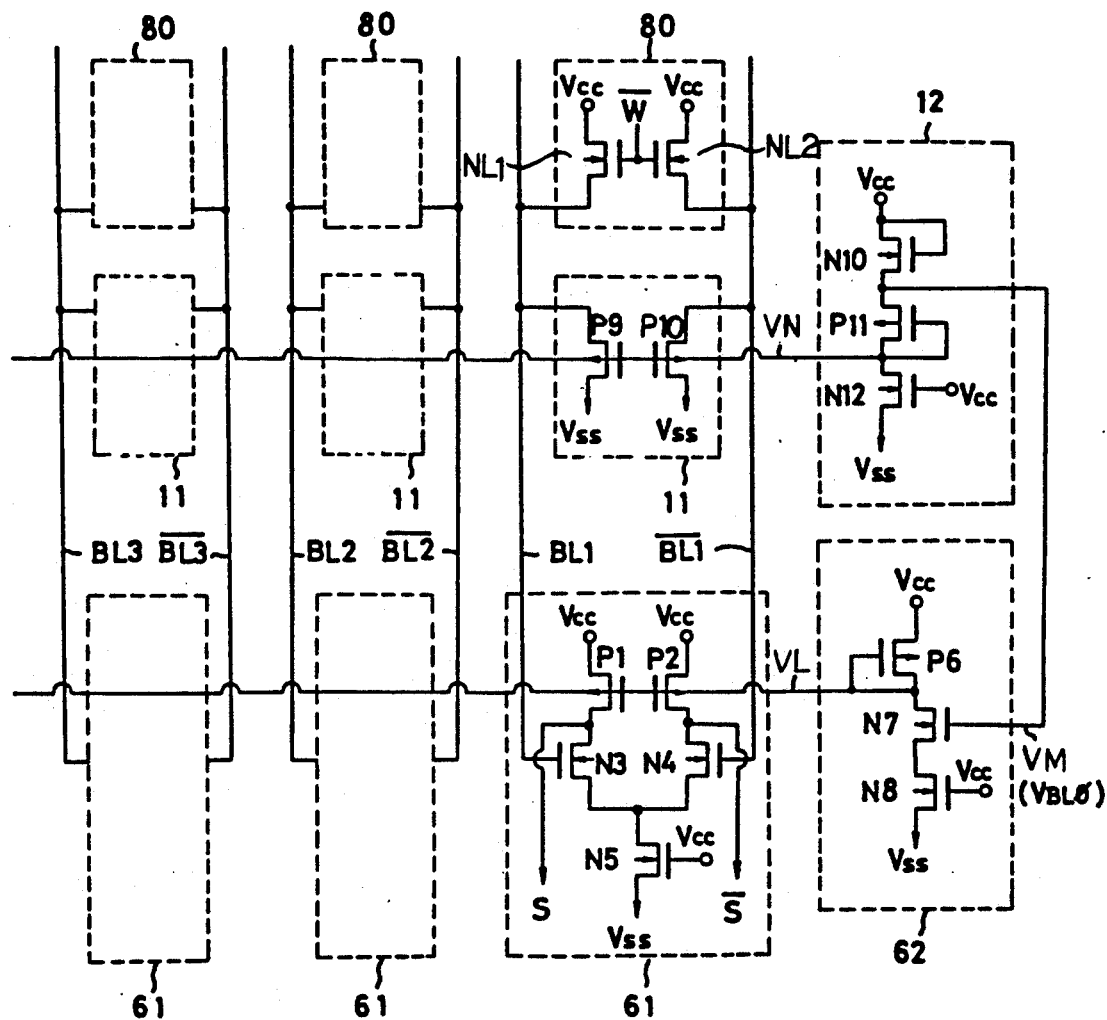
FIG. 9 is a circuit diagram of a second embodiment of the present invention.

FIG. 9 is a circuit diagram of a second embodiment of the present invention. In this embodiment, the first bias circuit 12 and the second bias circuit 62 are commonly used for a plurality of bit line pairs. Namely, in FIG. 9, (BL1, $\overline{BL1}$) to (BL3, $\overline{BL3}$) are bit line pairs. Each bit line pair includes load 80, an adjusting circuit 11 and a sense amplifier circuit 61.

The first bias circuit 12 provides the second bias voltage VN to the gate electrodes of the PMOS transistors P9 and P10 in the adjusting circuit 11, and the second bias circuit 62 provides the third bias voltage VL to the gate electrodes of the load transistors P1 and P2 in the sense amplifier circuit 61.

In this embodiment, the potential of each bit line pair is adjusted by the respective adjusting circuit 11. Since all adjusting circuits 11 are commonly controlled by the second bias voltage VN, the bit line initial potential of each bit line pair can be set to a predetermined value.

On the other hand, the load of the respective sense amplifier circuits 61 is also controlled by the third bias voltage VL which has a corelation with respect to the first bias voltage VM or to the bit line initial potential. Thus, the impedance of the load in each sense amplifier circuit 61 is adjustable so as to achieve a high sensitivity in each bit line pair.

Furthermore, since the first and the second bias circuits 12 and 62 are commonly used for a plurality of bit line pairs, the occupying area is effectively reduced.

Figure 10:
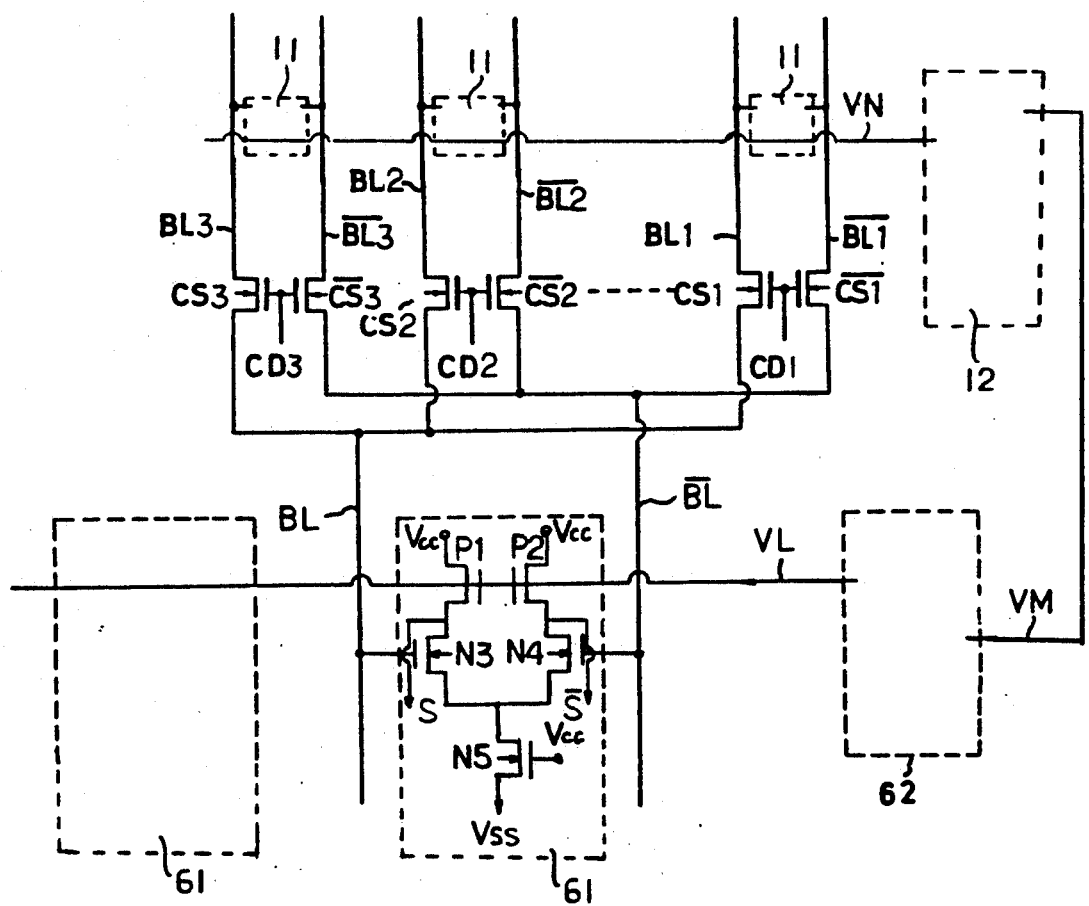
FIG. 10 is a circuit diagram of a third embodiment of the present invention.

FIG. 10 is a circuit diagram of a third embodiment of the present invention. In this embodiment, a sense amplifier circuit 61 is commonly used for sensing a data of a selected bit line pair. Namely, in this embodiment, the each bit line pair is connected to a common bit line pair BL and $\overline{BL}$ through a corresponding column select transistor pair (CS1, $\overline{CS1}$ to CS3, $\overline{CS3}$). Thus, when the column select transistors CS1 and $\overline{CS1}$ are made conductive by a column decode signal CD1, the bit line pair BL1 and $\overline{BL1}$ are connected to the common bit line pair BL and $\overline{BL}$ and sensed by the sense amplifier circuit 61.

Similarly to the second embodiment of FIG. 9, each bit line pair includes an adjusting circuit 11 controlled by the second bias voltage VN generated by the first bias circuit 12, and the load impedance of the sense amplifier circuit 61 is controlled by the third bias voltage VL having a corelation with respect to the bit line initial potential.

Thus, the impedance of the load of the sense amplifier circuit can be controlled to achieve a high sensitivity. Furthermore, since the sense amplifier circuit is commonly used for a plurality of bit line pairs, the occupying area can be effectively reduced.

The present invention has been described with respect to specific embodiments. However, other embodiments based on the principles of the present invention should be obvious to those of ordinary skill in the art. Such embodiments are intended to be covered by the claims.

What is claimed is:

1. A semiconductor memory device, comprising:
    a pair of bit lines having an initial potential and operating to transfer data from a memory cell;
    first bias means for producing a first bias voltage and a second bias voltage in response to a first power source voltage and a reference voltage;
    second bias means for producing a third bias voltage in response to the first power source voltage, the reference voltage and the first bias voltage;
    adjusting means coupled to the bit lines for adjusting the potential of the bit lines in response to the second bias voltage; and
    sensing means including a load circuit for sensing the data of the bit lines, wherein the impedance of the load circuit is controlled by the third bias voltage.

2. The semiconductor memory device of claim 1, wherein the first bias voltage is lower than the initial potential of the bit lines, and the second bias voltage is lower than the first bias voltage.

3. The semiconductor memory of claim 1, wherein the adjusting means includes a P-type MOS transistor having a source electrode supplied with the reference voltage, a drain electrode connected to the bit line and a gate electrode supplied with the second bias voltage.

4. The semiconductor memory device of claim 1, wherein the first bias means includes;
    a first N-type MOS transistor having a source electrode supplied with the power source voltage, a drain electrode and a gate electrode connected to the source electrode thereof;
    a first P-type MOS transistor having a drain electrode connected to the source electrode of the first N-type MOS transistor, a drain electrode and a gate electrode connected to the drain electrode thereof; and
    a second N-type MOS transistor having a drain electrode connected to the drain electrode of the first P-type MOS transistor, a source electrode supplied with the reference voltage and a gate electrode supplied with the power source voltage,
    wherein the first bias means produces the first bias voltage at the source electrode of the first N-type MOS transistor and produces the second bias voltage at the drain electrode of the first P-type MOS transistor.

5. The semiconductor memory device of claim 1, wherein the second bias means includes a second P-type MOS transistor having a source electrode supplied with the power source voltage, a source electrode, and a gate electrode connected to the source electrode thereof;
    a third N-type MOS transistor having a drain electrode connected to the drain electrode of the second P-type MOS transistor, a gate electrode supplied with the first bias voltage, and a source electrode; and a fourth N-type MOS transistor having a drain electrode connected to the source electrode of the third N-type MOS transistor and a gate electrode supplied with the power source voltage, wherein the second bias means provides the third bias voltage at the drain electrode of the second P-type MOS transistor.

6. The semiconductor memory device of claim 1, wherein the sensing means includes;
- a third P-type MOS transistor having a source electrode supplied with the power source voltage, a drain electrode, and a gate electrode supplied with the third bias voltage;
- a fourth P-type MOS transistor having a source electrode supplied with the power source voltage, a gate electrode supplied with the third bias voltage, and a drain electrode;
- a fifth N-type MOS transistor having a drain electrode connected to the drain electrode of the third P-type MOS transistor, a source electrode, and a gate electrode connected to one of the bit lines;
- a sixth N-type MOS transistor having a drain electrode connected to the drain electrode of the fourth P-type MOS transistor, a gate electrode connected to the remaining bit line, and a source electrode connected to the source electrode of the fifth N-type MOS transistor; and
- a seventh N-type MOS transistor having a drain electrode connected to the source electrodes of the fifth and the sixth N-type MOS transistors, a gate electrode supplied with the power source voltage, and a source electrode supplied with the reference voltage.

7. The semiconductor memory device of claim 3, further comprising a second bit line pair having adjusting means supplied with the second bias voltage for adjusting the potential of the second bit line pair.

8. A semiconductor memory device, comprising:
- a plurality of bit line pairs transferring data from a corresponding memory cell coupled to the respective bit line pairs;
- first bias means for producing a first bias voltage and a second bias voltage in response to a first power source voltage and a reference voltage;
- second bias means for producing a third bias voltage in response to the first power source voltage, the reference voltage and the first bias voltage;
- adjusting means coupled to the respective bit line pair for adjusting the potential of the bit lines of each bit line pair in response to the second bias voltage; and
- sensing means including a load circuit for sensing the data of the bit lines, wherein the impedance of the load circuit is controlled by the third bias voltage.

9. The semiconductor memory device of claim 8, wherein the sensing means senses the data of a selected bit line pair in the plurality of bit line pairs.

10. The semiconductor memory device of claim 8, wherein the sensing means is composed of a plurality of sense amplifier circuits which are individually coupled to the respective bit line pair.

* * * * *